United States Patent
Shi et al.

(10) Patent No.: US 11,442,021 B2
(45) Date of Patent: Sep. 13, 2022

(54) BROADBAND LIGHT INTERFEROMETRY FOR FOCAL-MAP GENERATION IN PHOTOMASK INSPECTION

(71) Applicant: KLA Corporation, Milpitas, CA (US)

(72) Inventors: Rui-Fang Shi, Cupertino, CA (US); Dmitry Skvortsov, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 86 days.

(21) Appl. No.: 17/063,622

(22) Filed: Oct. 5, 2020

(65) Prior Publication Data
US 2021/0109030 A1 Apr. 15, 2021

Related U.S. Application Data

(60) Provisional application No. 62/914,350, filed on Oct. 11, 2019.

(51) Int. Cl.
*G01N 21/88* (2006.01)
*G01N 21/956* (2006.01)
*G01B 11/06* (2006.01)

(52) U.S. Cl.
CPC ..... *G01N 21/8806* (2013.01); *G01B 11/0608* (2013.01); *G01N 21/956* (2013.01); *G01N 2021/95676* (2013.01)

(58) Field of Classification Search
CPC .............. G01B 11/0675; G01B 9/0209; G01B 9/02002; G01B 9/020007; G01B 9/02009; G01B 11/0608; G01B 9/0207; G01B 9/02075; G01B 9/02078; G03F 7/70408; G03F 9/7049; G01N 21/8806; G01N 21/956; G01N 2021/95676; G01N 21/45
See application file for complete search history.

(56) References Cited

U.S. PATENT DOCUMENTS

| 4,340,306 | A | * | 7/1982 | Balasubramanian | ........................ G01B 11/2441 356/513 |
| 5,706,084 | A | * | 1/1998 | Gutierrez | ........... G01B 9/02003 356/487 |
| 5,748,323 | A | * | 5/1998 | Levinson | .............. G03F 9/7026 250/201.3 |
| 6,160,621 | A | * | 12/2000 | Perry | ................. G01B 11/0683 250/559.27 |
| 6,184,992 | B1 | | 2/2001 | Durán et al. | |

(Continued)

FOREIGN PATENT DOCUMENTS

JP          02298095 A   * 12/1990

OTHER PUBLICATIONS

Abstract of JP-02298095-A from Google Patents, Feb. 23, 2022.*

(Continued)

*Primary Examiner* — Michael A Lyons
*Assistant Examiner* — Jarreas C Underwood
(74) *Attorney, Agent, or Firm* — Huse IP Law; Charles C. Huse (57) ABSTRACT

Heights on a surface of a photomask are measured using broadband light interferometry. The heights include heights of patterned areas of the photomask. A focal map is produced from the measured heights on the surface of the photomask. To produce the focal map, the measured heights of the patterned areas are adjusted based on fill factors for the patterned areas. The photomask is inspected for defects, using the focal map.

22 Claims, 9 Drawing Sheets

(56) References Cited

U.S. PATENT DOCUMENTS

| | | | |
|---|---|---|---|
| 6,185,315 B1* | 2/2001 | Schmucker | G06T 11/00 356/450 |
| 6,324,298 B1* | 11/2001 | O'Dell | H01L 21/67288 257/E21.53 |
| 6,844,272 B2* | 1/2005 | Taylor | G03F 7/70958 438/787 |
| 7,835,015 B1 | 11/2010 | Wright et al. | |
| 8,175,373 B2* | 5/2012 | Abbott | G06T 7/0006 356/237.4 |
| 9,110,039 B2 | 8/2015 | Wright et al. | |
| 9,746,315 B1* | 8/2017 | Schmit | G02B 21/0056 |
| 2002/0167651 A1* | 11/2002 | Boonman | G03F 7/703 356/399 |
| 2003/0091910 A1* | 5/2003 | Schwarzl | G03F 1/24 430/5 |
| 2004/0084622 A1* | 5/2004 | Kadyshevitch | H01J 37/32935 250/307 |
| 2005/0214653 A1* | 9/2005 | Lu | G03F 1/72 430/323 |
| 2005/0254065 A1* | 11/2005 | Stokowski | G01N 21/95684 356/601 |
| 2006/0007450 A1* | 1/2006 | Cantin | G01B 11/2518 356/605 |
| 2006/0119838 A1* | 6/2006 | Emer | G03F 7/70875 356/124 |
| 2007/0035712 A1* | 2/2007 | Gassner | G03F 7/70666 355/53 |
| 2008/0151265 A1* | 6/2008 | Vin | G03B 27/58 356/616 |
| 2009/0092905 A1 | 4/2009 | Nakaue et al. | |
| 2009/0296099 A1* | 12/2009 | Burger | G01B 11/0675 356/503 |
| 2011/0090511 A1* | 4/2011 | Medicus | G01B 9/02084 356/511 |
| 2012/0081538 A1* | 4/2012 | Ogawa | G01N 21/956 348/87 |
| 2013/0293879 A1 | 11/2013 | Honda et al. | |
| 2014/0002826 A1* | 1/2014 | Inoue | G01N 21/95607 356/601 |
| 2014/0065528 A1* | 3/2014 | Kasa | G03F 9/70 355/56 |
| 2015/0227654 A1* | 8/2015 | Hunsche | G06F 30/20 716/54 |
| 2015/0331312 A1* | 11/2015 | Hamamoto | G03F 1/24 430/311 |
| 2015/0346609 A1 | 12/2015 | Boef | |
| 2017/0074807 A1* | 3/2017 | Nishimura | G03F 1/60 |
| 2020/0041248 A1* | 2/2020 | Dunn | G01B 11/2441 |
| 2020/0117093 A1* | 4/2020 | Baselmans | G03F 7/70491 |

OTHER PUBLICATIONS

Daniel Malacara et al., Interferogram Analysis for Optical Testing, CRC Press (2nd ed. 2005), sections 5.1-5.3 and 6.1-6.4 (pp. 159-179 and 259-284).

PCT/US2020/055173, International Search Report, dated Jan. 20, 2021.

PCT/US2020/055173, Written Opinion of the International Searching Authority, dated Jan. 20, 2021.

* cited by examiner

BROADBAND LIGHT INTERFEROMETRY FOR FOCAL-MAP GENERATION IN PHOTOMASK INSPECTION

RELATED APPLICATION

This application claims priority to U.S. Provisional Patent Application No. 62/914,350, filed on Oct. 11, 2019, which is incorporated by reference in its entirety for all purposes.

TECHNICAL FIELD

This disclosure relates to photomask (i.e., reticle) inspection, and more specifically to focal mapping for photomask inspection.

BACKGROUND

Controlling the focal distance between a photomask and imaging optics during photomask inspection is important for defect-inspection sensitivity and repeatability. Focal-distance control is especially important for inspection of extreme ultraviolet (EUV) photomasks. Furthermore, different defects can exhibit different through-focus behaviors.

To control focus variation, the shape of the photomask is mapped before inspection. This process, which is referred to as focal mapping, produces a focal map that provides a trajectory to be followed during inspection to control the focal distance. For example, a servo control system may be used to adjust the imaging optics so that they follow the trajectory during inspection.

Focal mapping of modern photomasks (e.g., EUV photomasks), however, presents significant challenges. Traditional focal-mapping processes have used candidate positions in non-patterned areas on a photomask. The small pattern features and high pattern densities on modern photomasks make it difficult to find suitable non-patterned candidate positions. And three-dimensional electromagnetic effects associated with the high pattern densities cause focal offsets measured for patterned areas on photomasks to be incorrect, resulting in incorrect focal maps and trajectories.

SUMMARY

Accordingly, there is a need for accurate and quick focal-mapping techniques.

In some embodiments, a method includes measuring heights on a surface of a photomask using broadband light interferometry. The heights include heights of patterned areas of the photomask. The method also includes producing a focal map from the measured heights on the surface of the photomask. Producing the focal map includes adjusting the measured heights of the patterned areas based on fill factors for the patterned areas. The method further includes inspecting the photomask for defects, using the focal map.

In some embodiments, a photomask-inspection system includes a broadband light interferometer, photomask-inspection optics, one or more processors, and memory storing one or more programs for execution by the one or more processors. The one or more programs include instructions for measuring heights on a surface of a photomask using the broadband light interferometer. The heights include heights of patterned areas of the photomask. The one or more programs also include instructions for producing a focal map from the measured heights on the surface of the photomask. The instructions for producing the focal map include instructions for adjusting the measured heights of the patterned areas based on fill factors for the patterned areas. The one or more programs further include instructions for inspecting the photomask for defects with the photomask-inspection optics, using the focal map.

In some embodiments, a non-transitory computer-readable storage medium stores one or more programs for execution by one or more processors of a photomask-inspection system that further includes a broadband light interferometer and photomask-inspection optics. The one or more programs include instructions for measuring heights on a surface of a photomask using broadband light interferometry. The heights include heights of patterned areas of the photomask. The one or more programs also include instructions for producing a focal map from the measured heights on the surface of the photomask. The instructions for producing the focal map include instructions for adjusting the measured heights of the patterned areas based on fill factors for the patterned areas. The one or more programs further include instructions for inspecting the photomask for defects with the photomask-inspection optics, using the focal map.

BRIEF DESCRIPTION OF THE DRAWINGS

For a better understanding of the various described implementations, reference should be made to the Detailed Description below, in conjunction with the following drawings.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
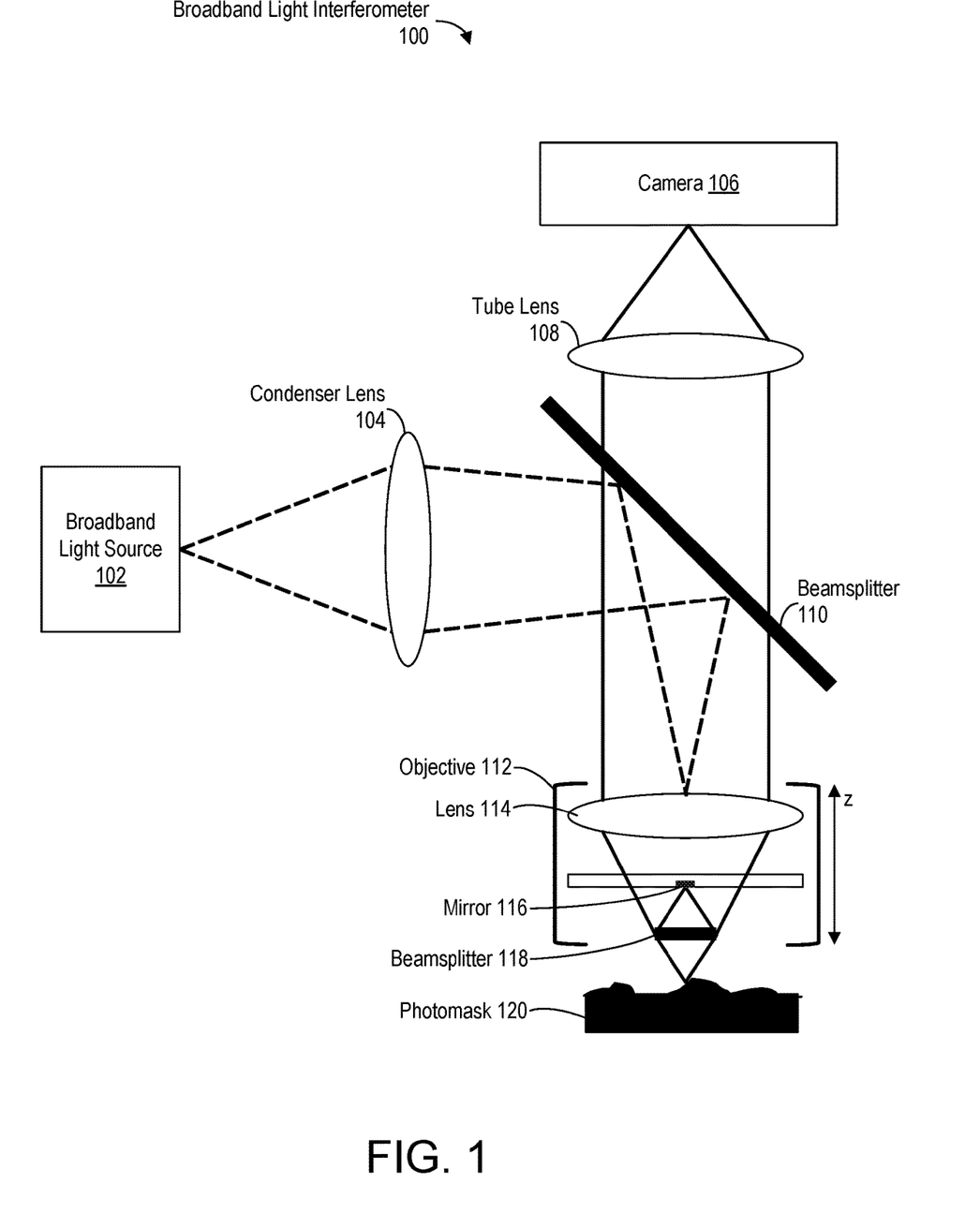
FIG. 1 shows a broadband light interferometer used to image a photomask to determine heights of respective areas on the surface of the photomask, in accordance with some embodiments.

FIG. 1 shows a broadband light interferometer 100 used to image (i.e., generate interferograms for) a photomask 120 to determine heights of respective areas on the surface of the photomask 120, in accordance with some embodiments. Patterning and bowing of the photomask 120 cause different areas on the surface of the photomask 120 to have different heights. The broadband light interferometer 100 has a low numerical aperture (NA). For example, the NA for the broadband light interferometer 100 is less than 0.15 (e.g., equals 0.10 or 0.075). The broadband light interferometer 100 performs Mirau interferometry. Alternatively, another type of broadband light interferometer (e.g., a Michelson interferometer) may be used to image the photomask 120.

The broadband light interferometer 100 includes a broadband light source 102. The use of broadband light reduces temporal coherence of the light for fringe-nulling purposes. In some embodiments, the broadband light source 102 provides visible light. In some embodiments, the wavelength band (e.g., color) of the light provided by the broadband light source 102 is adjustable. For example, light-emitting diodes (LEDs) and/or filters in the broadband light source 102 may be changed to change the wavelength band. In another example, the broadband light interferometer 100 may have multiple broadband light sources 102 that can be multiplexed into the optical path, each of which provides a different wavelength band.

A condenser lens 104 focuses light from the broadband light source 102 onto an objective 112, which is an Mirau-type objective in the example of FIG. 1. A beamsplitter 110 is situated between the condenser lens 104 and the objective 112 in the optical path to reflect the light from the broadband light source 102 onto the objective 112. The objective 112 includes a lens 114, mirror 116, and beamsplitter 118 in sequence. The beamsplitter 118 illuminates the surface of the photomask 120 with a portion of the light from the broadband light source 102 while reflecting, in conjunction with the mirror 116, another portion of the light from the broadband light source 102. The reflected portion serves as the reference light for the broadband light interferometer 100. The objective 112 collects light from the photomask 120. The collected light and the reference light, which interfere, are collimated by the lens 114 and transmitted through the beamsplitter 110 to a tube lens 108, which focuses them onto a camera 106 (e.g., a digital camera).

The image (i.e., interferogram) produced in the camera 106 includes interference effects resulting from interference between the collected light from the photomask and the reference light. The interference effects vary as a function of the height of the objective 112 above the photomask 120. The height of the objective 112 above the photomask 120 is adjustable. For example, the objective 112 may be on a z-scanning stage that can move the objective 112 up and down along the z-axis (i.e., adjust the z-height). The z-height can also be adjusted by moving the photomask under the objective with a z-scanning stage. Multiple images (i.e., interferograms) of the photomask 120 may be taken with the objective 112 at different heights (i.e., z-values) above the photomask 120, and the heights of respective areas on the surface of the photomask 120 may be determined by comparing the images, using interferogram analysis (e.g., known three-, four-, or five-step interferogram-based analysis algorithms).

The heights measured for patterned areas on the surface of the photomask will be incorrect due to the three-dimensional electromagnetic effects, however, and therefore cannot be directly used to produce a focal map for defect inspection. For example, assuming NA=0.10 and a central wavelength of 500 nm for the broadband light source 102 (which is an extended spatially incoherent light source), the smallest pitch that the broadband light interferometer 100 can resolve is $\lambda/(2*NA)=2.5$ um. This value is far above the pitch for patterns on photomasks for modern deep-submicron semiconductor devices. Below this pitch limit, the broadband light interferometer 100 observes an average effect of the dense patterns on the photomask 120 without resolving the features, such that only the zeroth-order diffracted light from the photomask 120 will interfere with the reference light. This effect results in incorrect height measurements. The error in the measured height varies as a function of the fill factor (e.g., defined as the area percentage not covered by absorber material 204, FIG. 2) for a patterned area on the photomask 120. The following discussion describes techniques for determining corrections to apply to the incorrect height measurements, to produce height values that may be used in a focal map of defect inspection. The corrections may be determined based on the fill factors. In some embodiments, the produced height values for the focal map are substantially pattern-independent: they depend on the fill-factor correction but not on the details of the patterns.

Figure 2:
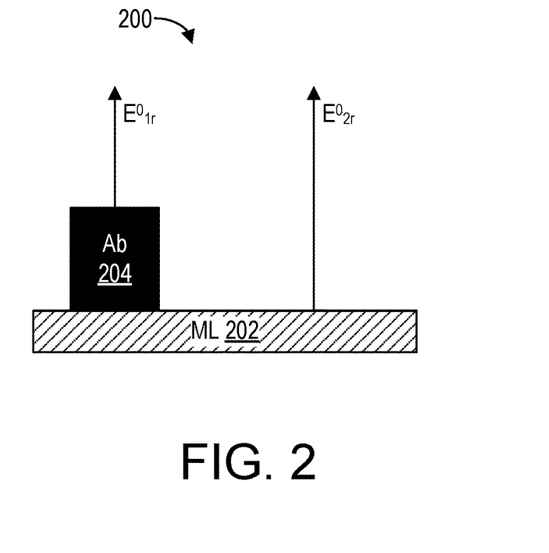
FIG. 2 is a side cross-sectional view of a patterned area on the surface of a photomask.

FIG. 2 is a side cross-sectional view of a patterned area 200 on the surface of the photomask 120. A portion of the patterned area 200 is covered by an absorber material (Ab) 204, which absorbs ultraviolet light (e.g., extreme ultraviolet light). The absorber material 204 is situated above a multilayer material (ML) 202. The remainder of the patterned area 200 is not covered by the absorber material 204, such that the multilayer material 202 is exposed. The multilayer material 202 (imperfectly) reflects light.

In some embodiments, the photomask 120 is for EUV (e.g., 13.5 nm) photolithography. The absorber material 204 absorbs the EUV (e.g., 13.5 nm) light and the multilayer material 202 partially reflects the EUV (e.g., 13.5 nm) light. The multilayer material 202 includes alternating layers of molybdenum (Mo) and silicon (Si) above a substrate (e.g., a blank photomask), with a capping layer covering the alternating layers of Mo and Si. The capping layer may be ruthenium (Ru) or boron (B). Each pair of adjacent Mo and Si layers is called a MoSi bilayer. The Mo layer thickness may be 2.8 nm, the Si layer thickness may be 4.2 nm, and the capping layer thickness may be 2.5 nm. The number of MoSi bilayers in the multilayer material 202 may be 40 or more, or 35 or more. The absorber material 204 includes a tantalum boron nitride (TaBN) layer with a tantalum boron oxide (TaBO) capping layer above the TaBN layer. The TaBO capping layer has a thickness of 2 nm. The thickness of the TaBN layer 310 may be 70-80 nm. These are merely respective examples of absorber materials and materials underlying the absorber materials (i.e., underlying materials that are exposed where the absorber material is absent). Other absorber materials and/or underlying materials can also be used in accordance with some embodiments.

Figure 3:
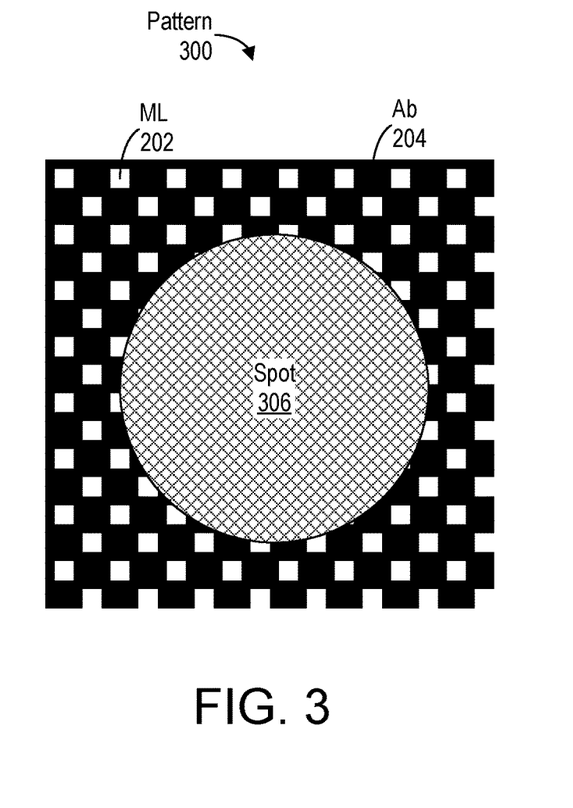
FIG. 3 is a plan view of a pattern on the surface of a photomask, illuminated by a spot of light from a broadband light interferometer, in accordance with some embodiments.

FIG. 3 is a plan view of a pattern 300 on the surface of the photomask 120, illuminated by a spot 300 of light from the broadband light interferometer 100 (FIG. 1), in accordance with some embodiments. The pattern 300 includes regions in which the multilayer material 202 is exposed and regions in which the absorber material 204 covers the multilayer material 202. The pattern 300 is periodic. Focal-mapping techniques described herein do not require periodic patterning, however, and may also be used for photomasks with non-periodic (e.g., random) patterning.

A patterned area, such as the patterned area 200 (FIG. 2) or an area in the pattern 300 (FIG. 3) has a fill factor a equal to the fraction of the area 200 that is not covered by the absorber material 204 (i.e., a is the fill factor for the exposed multilayer material 202). As shown in FIG. 2, $E_{1r}^0$ is the reflected electric field off the absorber material 204 (which is not a perfect absorber, such that $E_{1r}^0$ is non-zero) and $E_{2r}^0$ is the reflected electric field off the multilayer material 202 (which is not a perfect reflector). The zeroth-order diffracted light off of the patterned area 200 is:

$$E_{1r}^0 = (1-a)E_{1r}^0 + aE_{2r}^0 \quad (1).$$

The wavelength-dependent phase factor of $E_r^0$ is:

$$\phi(\lambda) = \phi(E_r^0(\lambda)) \quad (2).$$

Assuming that $w(\lambda)$ is the spectrum of light from the broadband light source 102 (FIG. 1), with $\lambda$ extending across the wavelength band of the light, the measured height (i.e., the effective height obtained through broadband light interferometry, which is different from the actual height) is:

$$h_{\it eff} = \frac{\int \frac{\lambda}{4\pi} \phi(\lambda) w(\lambda) d\lambda}{\int w(\lambda) d\lambda}. \quad (3)$$

In equation 3, $4\pi$ accounts for the double-pass of the light reflected by the surface of the photomask 120. Manipulating the zeroth-order diffracted light, the following equation is obtained:

$$E_r^0 = (1-a)|E_{1r}^0| + a|E_{2r}^0| \exp\left(i\left(\frac{4\pi t}{\lambda} + \phi_0\right)\right) \quad (4)$$

where t is the height (i.e., thickness) of the absorber material 204 and $\phi_0$ is the sudden phase change difference between reflection of light from the multilayer material 202 and from the absorber material 204.

Figure 4:
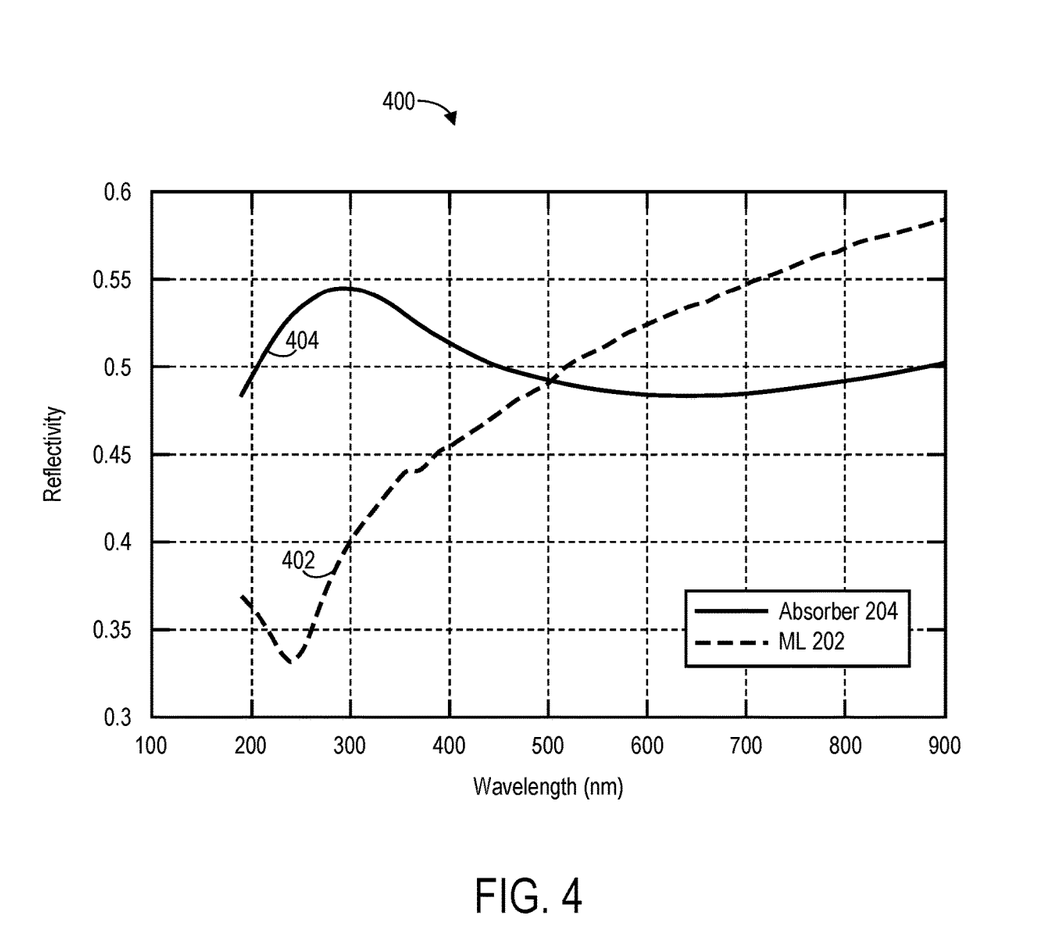
FIG. 4 is a graph showing measured reflectivity dispersion curves for multilayer material and absorber material on the surface of a photomask.

The absorber material 204 and multilayer material 202 are chosen to absorb and reflect light, respectively, at the appropriate photolithographic wavelength (e.g., at 13.5 nm for EUV photolithography). The absorber material 204 and multilayer material 202 are dispersive, however, and their reflectivity varies as a function of wavelength. FIG. 4 is a graph 400 showing measured reflectivity dispersion curves 402 and 404 (i.e., curves showing reflectivity versus wavelength) for the multilayer material 202 and the absorber material 204. In the example of FIG. 4, the multilayer material 202 and absorber material 204 are for 13.5 nm photolithography. The multilayer material 202 includes MoSi bilayers as described above. The absorber material 204 includes TaBN with a TaBO capping layer, as described above.

Figure 5:
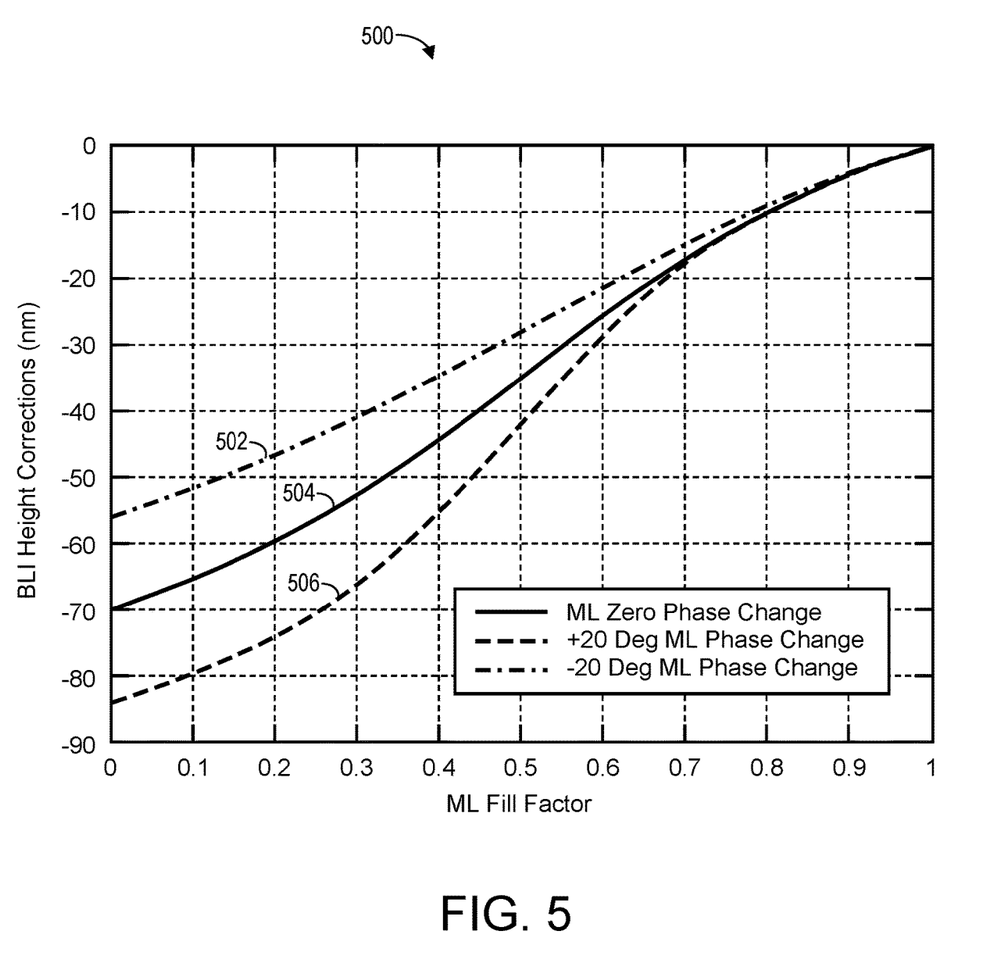
FIG. 5 is a graph showing calculated height-correction curves in accordance with some embodiments.

FIG. 5 is a graph 500 showing calculated height-correction curves in accordance with some embodiments. The height correction curves show height corrections, which are to be applied to photomask heights measured using broadband light interferometry, versus the fill factor a (i.e., the ML 202 fill factor). The height correction curves are calculated in accordance with equations 3 and 4, and vary as a function of the phase change of light upon reflection by the multilayer material 202. FIG. 5 shows a first curve 502 for a phase change of −20°, a second curve 504 for a zero-degree phase change, and a third curve 506 for a phase change of +20°. The actual phase change may be measured offline (e.g., using a calibration photomask), and the height-correction curve for the actual phase change calculated accordingly. In the example of FIG. 5, the height corrections are defined as negative and may be subtracted from the photomask heights measured using broadband light interferometry to provide a focal map that gives a trajectory for focusing the inspection optics (e.g., photomask-inspection optics 934, FIG. 9) on the top of the absorber material 204. The height corrections may alternatively be defined as positive and added to the measured photomask heights. In still other examples, the height corrections may be correction factors by which the measured photomask heights are multiplied or divided. Application of the height corrections may produce a focal map that gives a trajectory for focusing the inspection optics on top of the absorber material 204, on top of the multilayer material 202 (i.e., at the bottom of the absorber material 204), or on any predetermined surface in between these two surfaces.

Figure 6A:
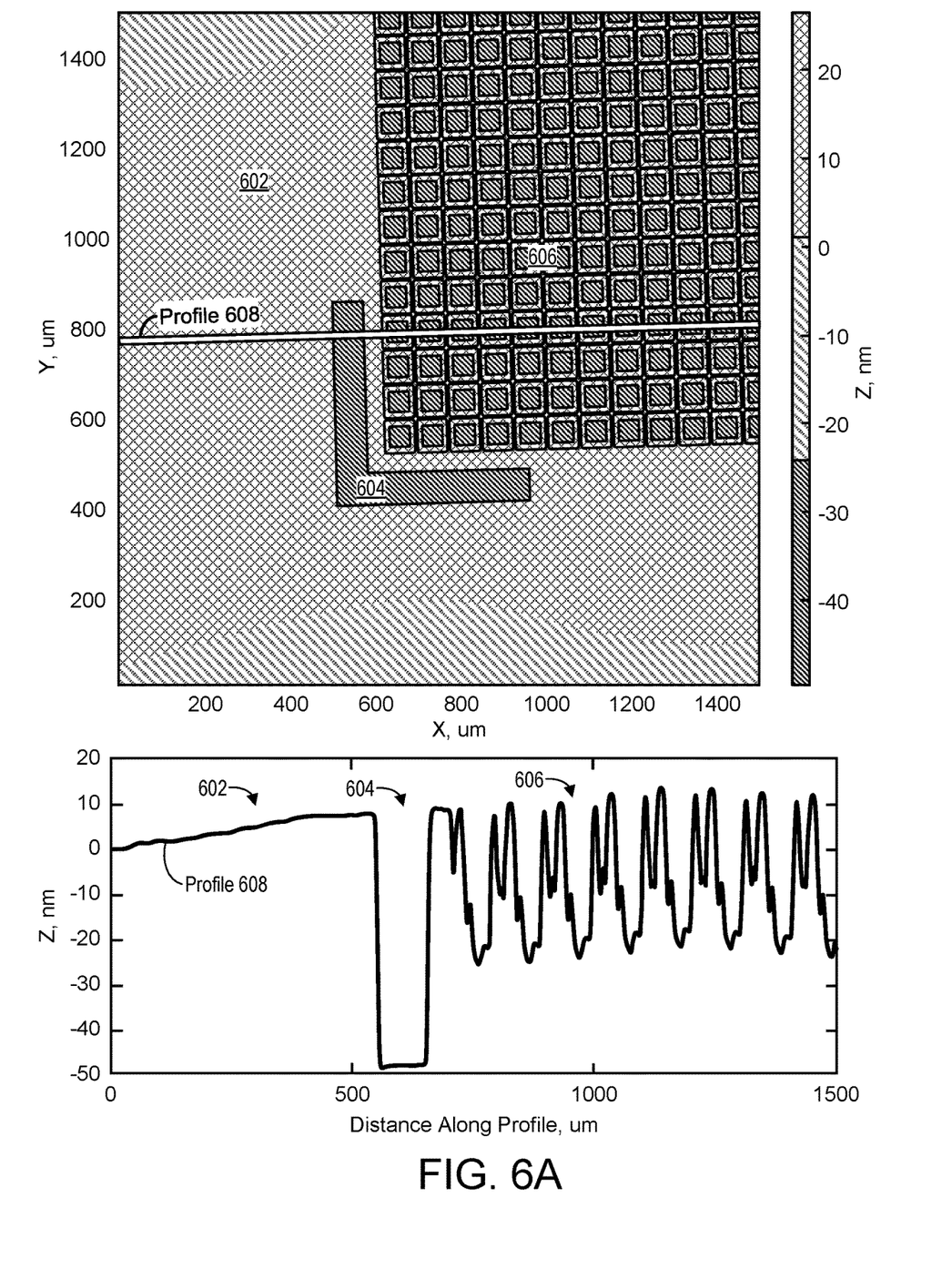
FIG. 6A shows a plan view of a height image of a photomask and a corresponding curve showing heights in a cross-sectional profile of the photomask, in accordance with some embodiments.
Figure 6B:
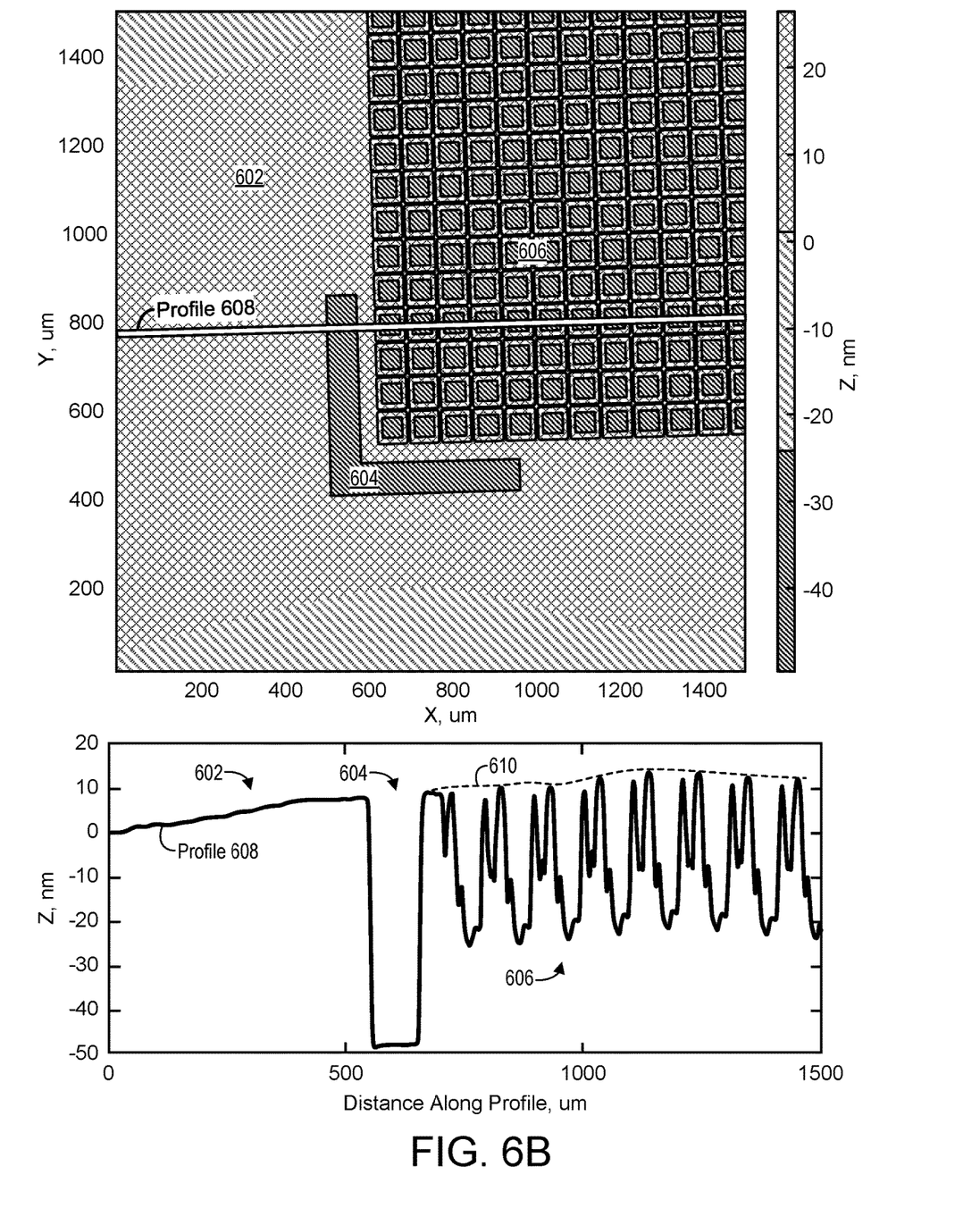
FIG. 6B shows the height-image plan view and corresponding cross-sectional profile curve of FIG. 6A along with a focal-map trajectory for a cross-section of patterned areas of the photomask, in accordance with some embodiments.

FIG. 6A shows a plan view of a height image of a photomask 120 and a corresponding curve showing heights in a cross-sectional profile 608 of the photomask 120, in accordance with some embodiments. The height image is generated by performing broadband light interferometry (e.g., using the broadband light interferometer 100, FIG. 1) to generate interferograms with the objective (e.g., objective 112, FIG. 1) at multiple respective heights (i.e., z-positions) above the photomask 120, and analyzing the interferograms to determine measured heights. In the example of FIG. 6A, the photomask 120 includes an unpatterned area 602 in which the multilayer material 202 is covered by absorber material 204, an area 604 (e.g., a target area) in which the absorber material 204 is absent and the multilayer material 202 is exposed, and patterned areas 606 in which portions of the multilayer material 202 are covered by absorber material 202. Ignoring patterning, height variation across the photomask 120 is primarily due to bowing of the photomask 120. For example, the height variation in the unpatterned area 602 is primarily due to bowing. The height (i.e., z-component) of each side of the area 604 corresponds to the height (i.e., thickness) of the absorber material 204. Heights in the patterned areas 606 similarly should step up and down by an amount equal to the height (i.e., thickness) of the absorber material 204, since the absorber material 204 is either present or absent at each point in the patterned areas 606. Broadband light interferometry, however, is not able to resolve the features in the patterned areas 606 (e.g., because the patterning pitch is less than the resolution limit). As a result, the measured heights in the patterned areas 606 include intermediate values, which are incorrect. Raw heights as measured through broadband light interferometry therefore cannot be used for focal mapping. Once height corrections (e.g., the height corrections of FIG. 5) have been applied to the raw heights, then the corrected heights may be used for focal mapping. In FIG. 6B, application of the height corrections in the patterned areas 606 for the profile 608 results in a trajectory 610 that can be used for the cross-section of the profile 608 through the patterned areas 606 in a focal map. The focal map allows the inspection optics (e.g., photomask-inspection optics 934, FIG. 9) to focus on the top of the absorber material 204 during defect inspection.

To obtain height corrections from a height-correction curve (e.g., one of the curves in FIG. 5), the fill factors for respective photomask areas are first determined. In some embodiments (e.g., for die-to-database inspection), the database of the design for the photomask is available and the fill factors are determined from the database (e.g., as in step 806 of the method 800, FIG. 8).

In other embodiments (e.g., for die-to-die inspection) (e.g., in which the database of the design for the photomask is not available), the fill factors can be determined based on average reflectivities. Each z-position (i.e., z-height) for the objective (or photomask) corresponds to a distinct phase index i. Taking interferograms with the objective at different z-positions corresponds to stepping through phase indices i, where the interferogram intensity is:

$$I_i = a + b \cos(\phi_i + \Delta) \quad (5)$$

where $\Delta$ is the phase (i.e., height) for the sample (i.e., photomask area) of interest, and coefficients a and b are related to the reflected light from the reference surface and the sample (i.e., photomask) surface in the broadband light interferometer. The coefficients a and b may be obtained through known analysis of the interferograms. Having obtained a and b, the ratio $|r_r/r_t|$ of the reference-surface reflectivity $r_r$ and the testing-surface reflectivity $r_t$ (i.e., the sample-surface reflectivity, which is the reflectivity of an area of the photomask surface) is deduced, again through known interferometric analysis. The reference-surface reflectivity $r_r$ is a known property of the broadband light interferometer, and the amplitude (i.e., magnitude) of the testing-surface reflectivity $r_t$ is determined accordingly.

Figure 7:
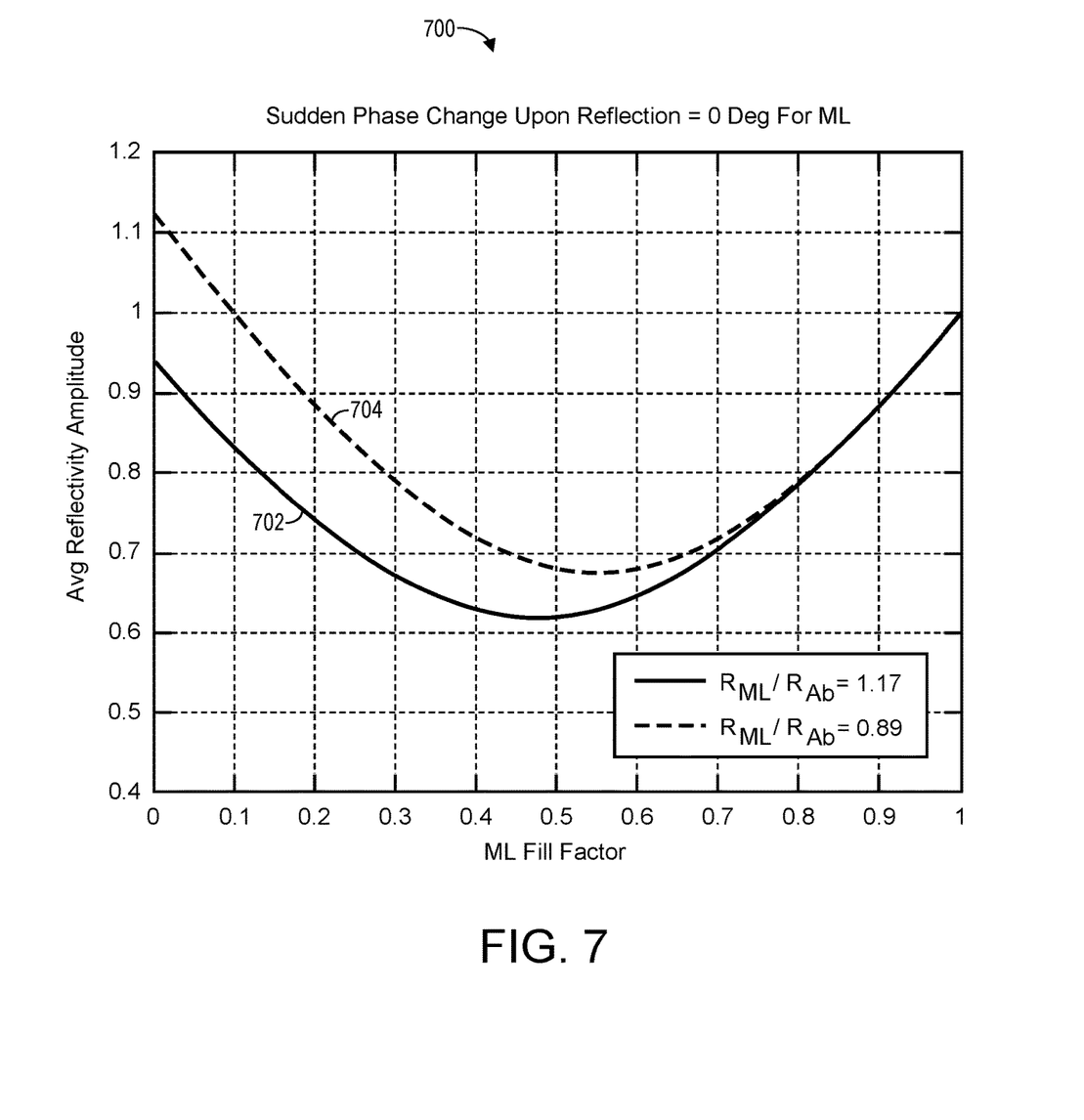
FIG. 7 is a graph showing curves of average reflectivity amplitude versus fill factor for different wavelength bands, in accordance with some embodiments.

FIG. 7 is a graph 700 showing curves of average reflectivity amplitude versus fill factor a (i.e., versus the multilayer-material 202 fill factor) for different wavelength bands (e.g., colors), in accordance with some embodiments. The curves of the graph 700 are calculated and thus prophetic. The curves include a first curve 702 for a first wavelength band in which the ratio of the reflectivity of the multilayer material 202 to the reflectivity of the absorber material 204 is 1.17 (i.e., $R_{ML}/R_{Ab}=1.17$) and a second curve 704 for a second wavelength band in which the ratio of the reflectivity of the multilayer material 202 to the reflectivity of the absorber material 204 is 0.89 (i.e., $R_{ML}/R_{Ab}=0.89$). The curves 702 and 704 are calculated assuming a zero-degree phase change upon reflection by the multilayer material 202 (e.g., as for the curve 504, FIG. 5). Similar curves may be calculated for other phase changes.

As the curves 702 and 704 show, the reflectivity for a single wavelength band does not specify a single fill factor: the correlation between reflectivities and fill factors is not one-to-one. In the curves 702 and 704, the correlation between reflectivities and fill factors is one-to-two (i.e., a respective reflectivity value corresponds to two fill factors). Multiple (e.g., two) different wavelength bands (e.g., colors), however, can be used together to determine a unique fill factor for measured reflectivities. For example, the broadband light interferometer 100 may be configured to generate interferograms using each of the two different wavelength bands (e.g., by changing LEDs in the broadband light source 102, changing filters in the broadband light source 102, or multiplexing multiple broadband light sources 102). Given the resulting reflectivity data, unique fill factors may be identified for respective photomask areas, using the curves 702 and 704.

Figure 8:
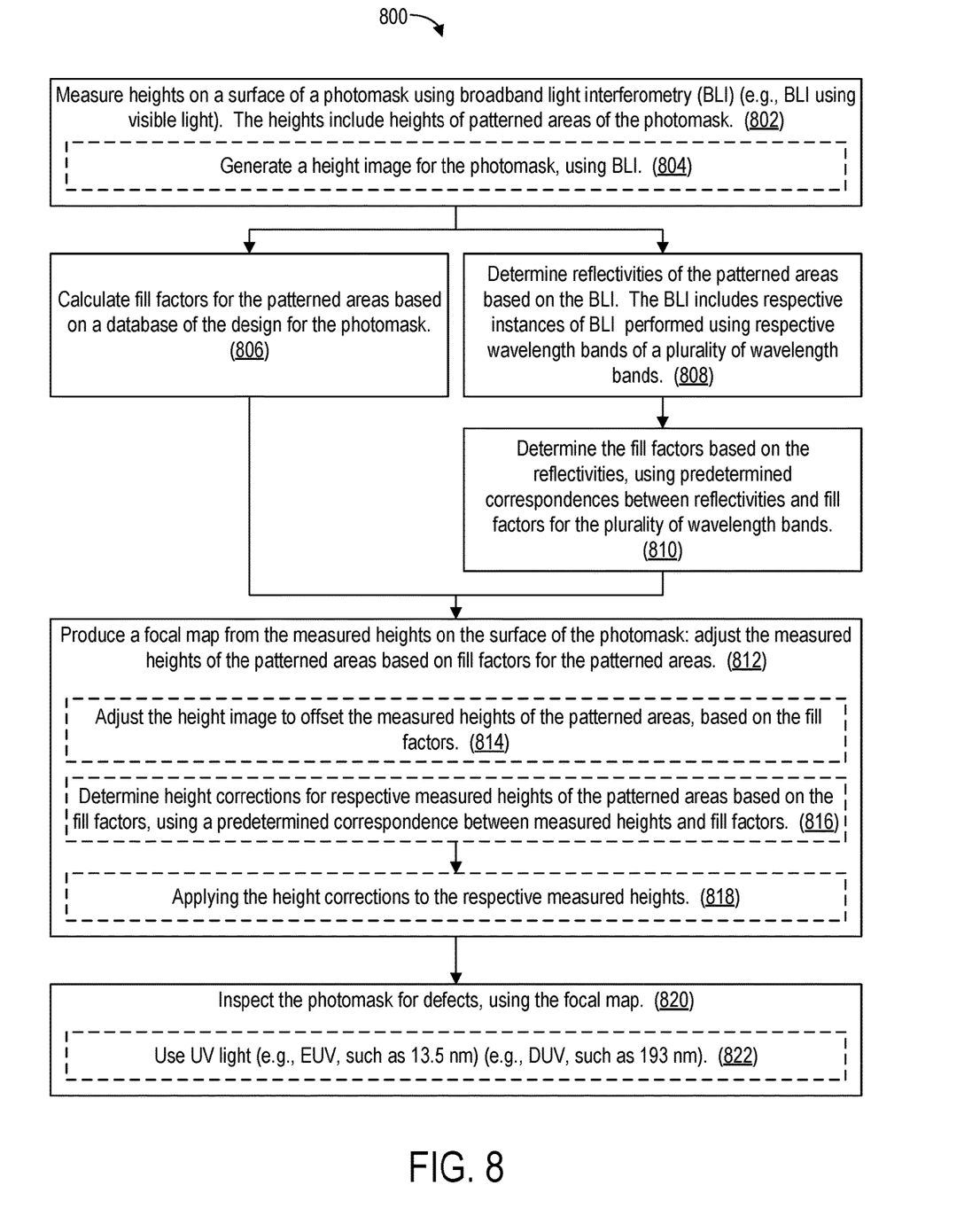
FIG. 8 is a flowchart showing a method for inspecting photomasks, in accordance with some embodiments.

FIG. 8 is a flowchart showing a method 800 for inspecting photomasks, in accordance with some embodiments. The method 800 may be performed by a photomask-inspection tool (e.g., photomask-inspection system 900, FIG. 9) that includes a broadband light interferometer (e.g., the broadband light interferometer 100, FIG. 1). In the method 800, heights on a surface of a photomask (e.g., photomask 120, FIG. 1) are measured (802) using broadband light interferometry (e.g., using Mirau interferometry or Michelson interferometry). The heights include heights of patterned areas of the photomask (e.g., areas patterned with an absorber material 204 situated above a multilayer material 202, FIGS. 2-3). In some embodiments, the broadband light interferometry uses visible light. In some embodiments, a height image (e.g., as shown in FIGS. 6A-6B) for the photomask is generated (804) using the broadband light interferometry. The height image may include measured heights for the entire photomask or a portion thereof. For example, the height image may include measured heights for a cross-section of the photomask (e.g., for the profile 608, FIGS. 6A-6B).

In some embodiments, fill factors (e.g., fill factors a for multilayer material 202) for the patterned areas are calculated (806) based on a database of the design for the photomask. For example, the database is a gds file or includes design data that was provided in a gds file. The design data in the database specifies where absorber material (e.g., absorber material 204, FIG. 2) is present and absent on the photomask, thus allowing fill factors to be calculated. This calculation of fill factors is performed, for example, for die-to-database inspection, in which the subsequent defect inspection of step 820 involves comparing results from inspecting the photomask to results from simulated inspection of the design in the database.

Fill factors (e.g., fill factors a for multilayer material 202) may alternatively be determined without using a database of the photomask design. In some embodiments, reflectivities (e.g., average reflectivities) of the patterned areas are determined (808) based on the broadband light interferometry (e.g., in accordance with equation 5). The broadband light interferometry includes respective instances of broadband light interferometry performed using respective wavelength bands (e.g., colors) of a plurality of wavelength bands (e.g., two wavelength bands), and the reflectivities are determined for each of the respective wavelength bands. The fill factors are determined (810) based on the reflectivities, using predetermined correspondences between reflectivities and fill factors for the plurality of wavelength bands (e.g., correspondences that are not one-to-one). For example, the fill factors are determined using correspondences like those shown in FIG. 7. The plurality of wavelength bands may include a first color and a second color. The predetermined correspondences may include a first correspondence between reflectivities and fill factors for the first color and a second correspondence between reflectivities and fill factors for the second color, with neither the first correspondence nor the second correspondence being one-to-one. This determination of fill factors based on reflectivities is performed, for example, for die-to-die inspection, in which the subsequent defect inspection of step 820 involves comparing results from inspecting a die area on the photomask to results from inspecting a reference photomask die area.

A focal map is produced (812) from the measured heights on the surface of the photomask. Producing the focal map includes adjusting the measured heights of the patterned areas based on fill factors for the patterned areas. In some embodiments, the height image is adjusted (814) to offset the measured heights of the patterned areas (e.g., including measured heights in a cross-section of the photomask, such as the cross-section for the profile 608, FIGS. 6A-6B), based on the fill factors. Height corrections for respective measured heights of the patterned areas may be determined (816) based on the fill factors, using a predetermined correspondence between measured heights and fill factors (e.g., using a correspondence like those shown in FIG. 5). The height corrections may be applied (818) to the respective measured heights (e.g., to produce a trajectory 610, FIG. 6B). The resulting focal map may be substantially pattern-independent (e.g., such that the light used for photomask inspection in step 820 is focused on the top of absorber material 204, on top of the multilayer material 202, or on any predetermined surface in between these two surfaces).

The photomask is inspected (820) for defects, using the focal map (i.e., the photomask-inspection optics focus the light used to inspect the photomask in accordance with the focal map). In some embodiments, ultraviolet (UV) light is used (822) to inspect the photomask. For example, extreme ultraviolet (EUV) (e.g., 13.5 nm) light or deep ultraviolet (DUV) (e.g., 193 nm) light is used. EUV is a common, well-known and well-understood technical term that refers to light with wavelengths in the range of 124 nm down to 10 nm. DUV is a common, well-known and well-understood technical term that refers to light with wavelengths in the range of 280 nm down to 100 nm.

Figure 9:
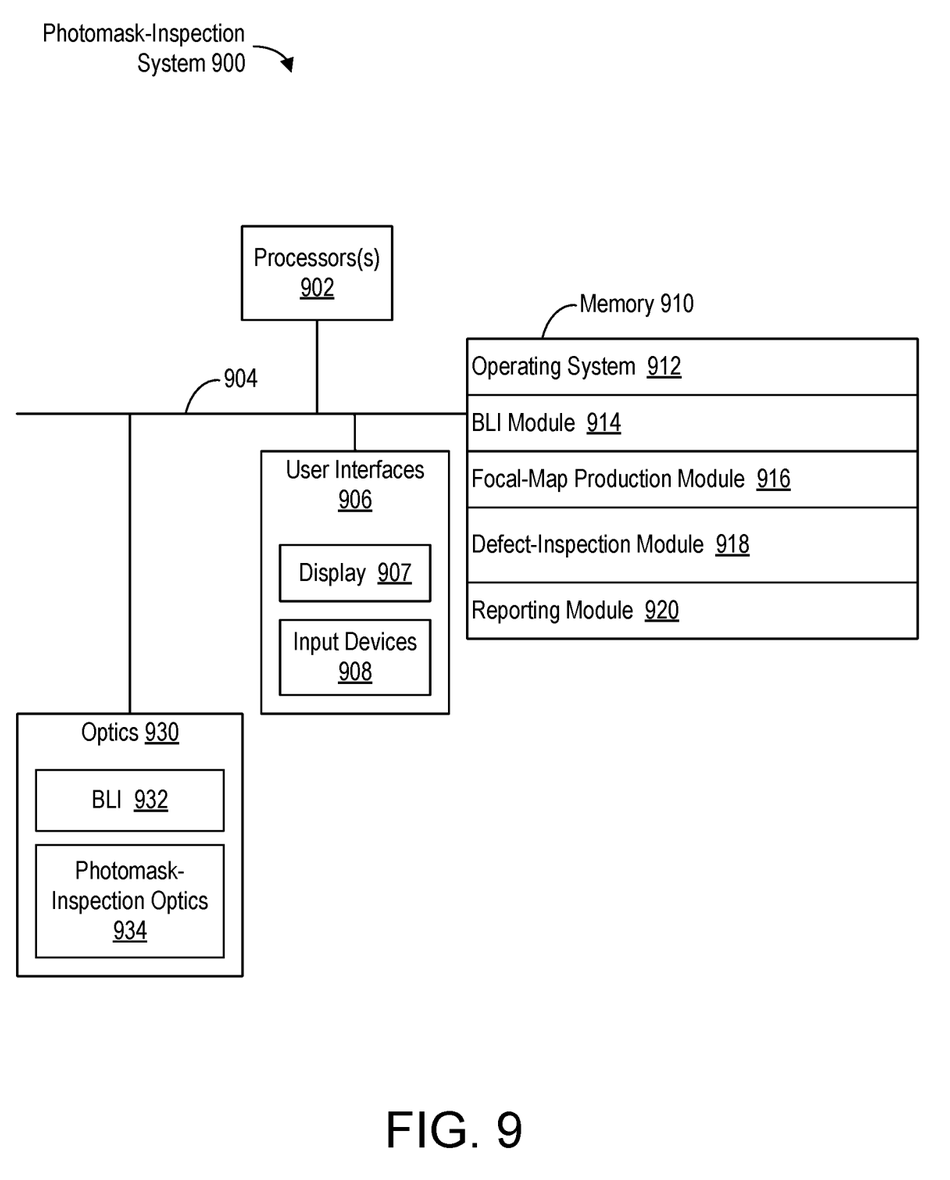
FIG. 9 is a block diagram of a photomask-inspection system in accordance with some embodiments.

FIG. 9 is a block diagram of a photomask-inspection system 900 in accordance with some embodiments. The photomask-inspection system 900 has optics 930, including a broadband light interferometer (BLI) 932 (e.g., the broadband light interferometer 100, FIG. 1) for measuring heights on photomasks (e.g., for generating interferograms that are used to create height images, such as the height image of FIGS. 6A-6B) and photomask-inspection optics 934 for inspecting photomasks for defects. In some embodiments, the broadband light interferometer 932 uses a visible wavelength band. The wavelength band used by the broadband light interferometer 932 may be variable (e.g., by multiplexing different light sources, using filters, or changing LEDs). For example, the broadband light interferometer 932 may be configured to use multiple visible wavelength bands. In some embodiments, the photomask-inspection optics 934 include ultraviolet optics, with corresponding ultraviolet light being used for defect inspection. For example, the photomask-inspection optics 934 may include EUV optics (e.g., for 13.5 nm light) or DUV optics (e.g., for 193 nm light).

The photomask-inspection system 900 also includes a computer system with one or more processors 902 (e.g., CPUs), optional user interfaces 906, memory 910, and one or more communication buses 904 interconnecting these components and the optics 930 (and other components of the photomask-inspection system 900 that are not shown, such as photomask-handling robotics). The user interfaces 906 may include a display 907 and one or more input devices 908 (e.g., a keyboard, mouse, touch-sensitive surface of the display 907, etc.). The display may show height images, focal maps, and defect-inspection data and may report the status of the photomask-inspection system 900 (e.g., the status of the method 800, FIG. 8).

Memory 910 includes volatile and/or non-volatile memory. Memory 910 (e.g., the non-volatile memory within memory 910) includes a non-transitory computer-readable storage medium. Memory 910 optionally includes one or more storage devices remotely located from the processor(s) 902 and/or a non-transitory computer-readable storage medium that is removably inserted into the computer system of the photomask-inspection system 900. In some embodiments, memory 910 (e.g., the non-transitory computer-readable storage medium of memory 910) stores the following modules and data, or a subset or superset thereof: an operating system 912 that includes procedures for handling various basic system services and for performing hardware-dependent tasks, a broadband light interferometry (BLI) module 914 for controlling the broadband light interferometer 932, a focal-map production module 916, a defect-inspection module 918 for controlling photomask defect inspection using the photomask-inspection optics 934, and a reporting module 920 for reporting results from the modules 914, 916, and/or 918. The memory 910 (e.g., the non-transitory computer-readable storage medium of the memory 910) includes instructions for performing all or a portion of the method 800 (FIG. 8). Each of the modules stored in the memory 910 corresponds to a set of instructions for performing one or more functions described herein. Separate modules need not be implemented as separate software programs. The modules and various subsets of the modules may be combined or otherwise re-arranged. In some embodiments, the memory 910 stores a subset or superset of the modules and/or data structures identified above.

FIG. 9 is intended more as a functional description of the various features that may be present in the photomask-inspection system 900 than as a structural schematic. For example, the functionality of the computer system of the photomask-inspection system 900 may be split between multiple devices. A portion of the modules stored in the memory 910 may alternatively be stored in one or more other computer systems communicatively coupled with the photomask-inspection system 900 through one or more networks.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A method, comprising:
measuring heights on a surface of a photomask using broadband light interferometry, the heights comprising heights of patterned areas of the photomask;
producing a focal map from the measured heights on the surface of the photomask, comprising adjusting the measured heights of the patterned areas based on fill factors for the patterned areas; and
inspecting the photomask for defects, using the focal map.

2. The method of claim 1, wherein:
the measuring comprises generating a height image for the photomask, using the broadband light interferometry; and
the adjusting comprises adjusting the height image to offset the measured heights of the patterned areas, based on the fill factors.

3. The method of claim 1, wherein:
the broadband light interferometry uses visible light; and
inspecting the photomask for defects is performed using ultraviolet light.

4. The method of claim 3, wherein the ultraviolet light is 13.5 nm light.

5. The method of claim 3, wherein the ultraviolet light is 193 nm light.

6. The method of claim 1, wherein the broadband light interferometry is Mirau interferometry.

7. The method of claim 1, wherein the broadband light interferometry is Michelson interferometry.

8. The method of claim 1, further comprising calculating the fill factors based on a database of the design for the photomask.

9. The method of claim 8, wherein adjusting the measured heights comprises:
   determining height corrections for respective measured heights of the patterned areas based on the fill factors, using a predetermined correspondence between measured heights and fill factors; and
   applying the height corrections to the respective measured heights.

10. The method of claim 1, further comprising:
    determining reflectivities of the patterned areas based on the broadband light interferometry, wherein the broadband light interferometry comprises respective instances of broadband light interferometry performed using respective wavelength bands of a plurality of wavelength bands; and
    determining the fill factors based on the reflectivities, using predetermined correspondences between reflectivities and fill factors for the plurality of wavelength bands;
    wherein adjusting the measured heights comprises:
       determining height corrections for respective measured heights of the patterned areas based on the fill factors, using a predetermined correspondence between measured heights and fill factors; and
       applying the height corrections to the respective measured heights.

11. The method of claim 10, wherein:
    the plurality of wavelength bands comprises a first color and a second color;
    the predetermined correspondences comprise a first correspondence between reflectivities and fill factors for the first color and a second correspondence between reflectivities and fill factors for the second color; and
    neither the first correspondence nor the second correspondence is one-to-one.

12. A photomask-inspection system, comprising:
    a broadband light interferometer;
    photomask-inspection optics;
    one or more processors; and
    memory storing one or more programs for execution by the one or more processors, the one or more programs comprising instructions for:
       measuring heights on a surface of a photomask using the broadband light interferometer, the heights comprising heights of patterned areas of the photomask;
       producing a focal map from the measured heights on the surface of the photomask, comprising adjusting the measured heights of the patterned areas based on fill factors for the patterned areas; and
       inspecting the photomask for defects with the photomask-inspection optics, using the focal map.

13. The photomask-inspection system of claim 12, wherein:
    the instructions for measuring the heights comprise instructions for generating a height image for the photomask, using the broadband light interferometer; and
    the instructions for adjusting the measured heights comprise instructions for adjusting the height image to offset the measured heights of the patterned areas, based on the fill factors.

14. The photomask-inspection system of claim 12, wherein:
    the broadband light interferometer is a visible-light interferometer; and
    the photomask-inspection optics comprise 13.5 nm optics.

15. The photomask-inspection system of claim 12, wherein:
    the broadband light interferometer is a visible-light interferometer; and
    the photomask-inspection optics comprise 193 nm optics.

16. The photomask-inspection system of claim 12, wherein the broadband light interferometer is a Mirau interferometer.

17. The photomask-inspection system of claim 12, wherein the broadband light interferometer is a Michelson interferometer.

18. The photomask-inspection system of claim 12, wherein the one or more programs further comprise instructions for calculating the fill factors based on a database of the design for the photomask.

19. The photomask-inspection system of claim 18, wherein the instructions for adjusting the measured heights comprise:
    instructions for determining height corrections for respective measured heights of the patterned areas based on the fill factors, using a predetermined correspondence between measured heights and fill factors; and
    instructions for applying the height corrections to the respective measured heights.

20. The photomask-inspection system of claim 12, wherein:
    the one or more programs further comprise instructions for:
       determining reflectivities of the patterned areas based on the broadband light interferometry, wherein the broadband light interferometry comprises respective instances of broadband light interferometry performed using respective wavelength bands of a plurality of wavelength bands; and
       determining the fill factors based on the reflectivities, using predetermined correspondences between reflectivities and fill factors for the plurality of wavelength bands; and
    the instructions for adjusting the measured heights comprise instructions for:
       determining height corrections for respective measured heights of the patterned areas based on the fill factors, using a predetermined correspondence between measured heights and fill factors; and
       applying the height corrections to the respective measured heights.

21. The photomask-inspection system of claim 20, wherein:
    the plurality of wavelength bands comprises a first color and a second color;
    the predetermined correspondences comprise a first correspondence between reflectivities and fill factors for the first color and a second correspondence between reflectivities and fill factors for the second color; and
    neither the first correspondence nor the second correspondence is one-to-one.

22. A non-transitory computer-readable storage medium storing one or more programs for execution by one or more processors of a photomask-inspection system that further comprises a broadband light interferometer and photomask-inspection optics, the one or more programs including instructions for:

measuring heights on a surface of a photomask using broadband light interferometry, the heights comprising heights of patterned areas of the photomask;

producing a focal map from the measured heights on the surface of the photomask, comprising adjusting the measured heights of the patterned areas based on fill factors for the patterned areas; and inspecting the photomask for defects with the photomask-inspection optics, using the focal map.

* * * * *